United States Patent [19]

Li et al.

[11] Patent Number: 4,896,044
[45] Date of Patent: Jan. 23, 1990

[54] SCANNING TUNNELING MICROSCOPE NANOETCHING METHOD

[75] Inventors: Yun-Zhong Li; Ronald G. Reifenberger; Ronald P. Andres, all of West Lafayette, Ind.

[73] Assignee: Purdue Research Foundation, West Lafayette, Ind.

[21] Appl. No.: 312,768

[22] Filed: Feb. 17, 1989

[51] Int. Cl.$^4$ .......................................... H01J 37/305
[52] U.S. Cl. .............................. 250/492.3; 250/492.2; 346/158; 369/101
[58] Field of Search ......................... 250/492.3, 492.2; 346/158; 369/101

[56] References Cited

U.S. PATENT DOCUMENTS 4,785,189 11/1988 Wells ................................. 250/492.3
4,786,922 11/1988 Hosoki et al. ...................... 346/158

OTHER PUBLICATIONS

McCord, M. A. and Pease, R. F. W., "Lithography with the Scanning Tunneling Microscope", *J. Vac. Sci. Technol.* B 4(1), Jan./Feb. 1986.

Abraham, David W., Mamin, H. Jonathon, Ganz, Eric, and Clarke, John, "Surface Modification with the Scanning Tunneling Microscope", *IBM J. Res. Develop.*, vol. 30, No. 5, Sep., 1986.

McCord, M. A., and Pease, R. F. W., "Exposure of Calcium Fluoride Resist with the Scanning Tunneling Microscope", *J. Vac. Sci. Technol.* B 5(1), Jan./Feb., 1987.

Schneir, J., Sonnenfeld, R., Marti, O., Hansma, P. K., Demuth, J. E., and Hamers, R. J., "Tunneling Microscopy, Lithography, and Surface Diffusion On An Easily Prepared Atomically Flat Gold Surface", *J. Appl. Phys.* 63, (3), 1 Feb. 1988.

Schneir, J., Marti, O., Remmers, G., Glaser, D., Sonenfeld, R., Drake, B., Hansma, P. K., and Elings, V., "Scanning Tunneling Microscopy and Atomic Force Microscopy of the Liquid–Solid Inteface", *J. Vac. Sci. Technol.* A 6(2), Mar./Apr., 1988.

McCord, M. A., Kern, D. P., and Chang, T. H. P., "Direct Deposition of 10nm Metallic Features with the Scanning Tunneling Microscope", RC 13840 (#62027) 6/22/88.

Primary Examiner—Jack I. Berman
Attorney, Agent, or Firm—Barnes & Thornburg

[57] ABSTRACT

A method is described for forming uniform nanometer sized depressions on the surface of a conducting substrate. A tunneling tip is used to apply tunneling current density sufficient to vaporize a localized area of the substrate surface. The resulting depressions or craters in the substrate surface can be formed in information encoding patterns readable with a scanning tunneling microscope.

9 Claims, 3 Drawing Sheets

SCANNING TUNNELING MICROSCOPE NANOETCHING METHOD

This invention relates to a method for nanometer scale modifications of a substrate surface. More particularly this invention is directed to a method for creating substantially uniform topographic depressions on the surface of a conducting substrate by localized vaporization of the substrate surface. The method enables information storage/retrieval and lithographic applications with nanometer scale resolution.

BACKGROUND AND SUMMARY OF THE INVENTION

A scanning tunneling microscope is capable of atomic scale imaging of conducting substrates. A very sharp metal tip, ideally having only a single atom at the tip apex, but typically being 3 to 10 atoms in diameter at the tip, is brought close enough to a conducting substrate so that a tunneling current exists between the tip and the substrate under an applied bias voltage. The tip is generally mounted on three orthogonal piezoelectric elements corresponding to the x, y and z directions. By appropriately changing the voltage supplied to each piezo element the tip can be moved as desired in any direction. For the purpose of resolving surface structure, the voltage supplied to the x and the y piezo elements is controlled to give a raster scan of the substrate. The height of the tip above the substrate is kept constant, so variations in the voltage supplied to the z-piezo correspond to changes in the height of the surface. The end result is a topographic map of the surface of the substrate capable of resolving height differences as little as 1/100 of an atomic diameter.

The distance between the tip and the surface of the substrate is kept constant by changing the voltage applied to the z-piezo element. The exact voltage applied to the z-piezo element is controlled by a feedback circuit that maintains a constant tunneling current between the tip and the substrate. Since the tunneling current is exponentially dependent on the distance of the tip to the substrate, the deviations along the z-axis can be precisely determined and recorded.

A scanning tunneling microscope has been used to modify a substrate. For instance, U.S. Pat. No. 4,550,257 discloses a method of fabricating narrow lines on a substrate by operating a scanning tunneling microscope in an atmosphere containing an electrically decomposable gas with a field energy value matched to the energy required to dissociate the molecules of the gas. By this apparatus a narrow line composed of the dissociated product of the gas can be formed on a substrate.

Other workers have produced indentations in a substrate by physically scratching the substrate with a tip (Abraham et al., *IBM J.Res Develoo.*, Vol. 30, No. 5 Sept. 1986), or created hillocks in a substrate surface by applying tunneling currents to the substrate over times ranging up to about 3 seconds (Staufer et al., *J. Vac.Sci.-Tech. A.* 6(2), Mar/Apr 1988). Electron beams can also be formed using a scanning tunneling microscope tip and used for material modification or electron beam lithography (McCord and Pease, J. Vac.Sci.Tech. B., 4(1), Jan/Feb 1986).

The method of the present invention allows the formation of substantially uniform topographic depressions in the surface of a conducting substrate by localized vaporization of the substrate surface. A tunneling tip, which constitutes any stylus or tip ideally terminating in an atomically sharp point, is positioned at a location above a conducting substrate close enough to the surface of the conducting substrate so that a tunneling current between the tunneling tip and the conducting substrate is detectable upon application of a predetermined bias voltage. A topographic depression is formed by application of a transient increase in the tunneling current between the tunneling tip and the substrate. This creates a current power density sufficient to cause localized vaporization of the substrate surface to form a distinguishable crater (depression) in the substrate surface. Craters formed by this method are of reproducible size and long-lived.

A computer controlled scanning tunneling microscope is particularly suitable for the practice of the method of the present invention. Many designs exist for scanning tunneling microscopes. Typically, they utilize a sensed tunneling current between a tip and a substrate to control, by means of a feedback circuit, a z-piezo element that automatically adjusts the height of the tunneling tip above the substrate surface. Scanning tunneling microscopes such as those disclosed in U.S. Pat. No. 4,343,993 by Binnig et al. and in U.S. Pat. No. 4,668,865 by Gimzewski et al., both of which are herein incorporated by reference, are suitable for use in the method of this invention. Commonly available scanning tunneling microscopes are capable of operating in air as well as vacuum, and can resolve the surface structure of a wide variety of conducting substrates. An added advantage of using a scanning tunneling microscope is that the same instrument can be used both to practice the method of the present invention and to ascertain if the topographic depressions or craters have been properly formed at the predetermined position.

For the purposes of the present invention, the tunneling tip of the scanning tunneling microscope can be positioned above an atomically smooth substrate at a desired location, and at a distance above the surface such that a tunneling current exists between the tunneling tip and the substrate at a predetermined bias voltage. positioning devices such as disclosed in U.S. Pat. No. 4,762,996 by Binning et al., can be used to locate the tunneling tip. The tunneling current is transiently increased to provide a power densitY sufficient for localized vaporization of a conducting substrate surface in the region under the tip preferably by stepping or pulsing the bias voltage.

The power density of incident tunneling current required to vaporize a localized portion of the substrate surface is dependent on the nature of the substrate. For atomically flat gold surfaces, a transient tunneling current having a peak of about 100 nanoamperes for 200 microseconds will form well defined craters in the gold substrate having a diameter between 1 and 5 nanometers and having a depth of about one quarter the diameter of the crater. By scanning the tunneling tip over the substrate, and transiently increasing the tunneling current to a predetermined value at predetermined times during the scan, a patterned series of craters or furrows can be formed on the surface. The tunneling current can be increased, for example, by programmed transient stepped increases in the bias voltage or by programmed repositioning of the tunneling tip closer to the substrate surface.

The use of resist techniques to modify a substrate in a manner conducive to later processing by Chemical or sputter etching are also possible using this method if the substrate is coated with a suitable resist layer prior to substrate etching. Lithographic techniques utilizing this method are expected to be particularly effective where the substrate is coated with a covalently bound organic monolayer. Carbon chains of about 12 to about 18 carbon atoms in length can be covalently attached to metal substrates through a terminal thiol group. Self-assembling monomolecular films composed of optionally substituted carbon chains covalently bound to the surface of a gold substrate are known in the art (Nuzzo et al., *J. Am. Chem. Soc.*, 105, 481, 1983). Such surface-modified gold substrates can be utilized in accordance with this invention.

Because of the nanometer scale of the surface features created in accordance with this method, extremely high density storage of data is possible. A substrate surface Can be modified by this method to store information in the form of ordered or patterned arrays of uniform depressions in the substrate surface. Thus tunneling tip is positioned over a conducting surface so that a tunneling current is detectable in said tunneling tip upon application of a predetermined bias voltage. Transiently increasing the tunneling current increases the power density sufficiently to cause localized vaporization of the substrate surface. Repeating these two steps at predetermined/programmed positions enables the creation of an information carrying pattern in the substrate surface.

A scanning tunneling microscope can be used both to create an information carrying pattern and to detect or read the encoded information in a previously formed pattern on a substrate. A further use of this method is the fabrication, modification, or repair of devices having nanometer scale features. The reproducibility of substrate modifications made in accordance with the present method permit such modifications to be made on a smaller scale and with more precision than any other known method.

DETAILED DESCRIPTION OF THE INVENTION

A substrate suitable for the present method of nanoetching by creating topographical depressions is any conducting material that can be made essentially atomically flat. Non-atomically flat materials could be nanoetched by the present method, but there would exist a problem of distinguishing a nanoetched feature from a natural irregularity in the substrate. Because of their atomic scale regularity and high conductivity, metals are a preferred substrate for the method of the present invention. A most preferred substrate for use in this method is gold.

A tunneling tip can be positioned at a desired location over the substrate so that a tunneling current between the tunneling tip and the substrate will exist upon application of a predetermined bias voltage in any convenient manner. Excellent results are obtained if the tunneling tip is an integral part of a scanning tunneling microscope, which can not only precisely position the tunneling tip, but can also be used to image the substrate after nanoetching is completed to verify nanometer scale crater/depression formation in the substrate. Alternative devices such as a scanning tunneling microscope having multiple tips, with at least one tunneling tip suitable for positioning and additional tunneling tips suitable for nanoetching can be used. Another contemplated embodiment for positioning a tunneling tip for use in accordance with this method utilizes an atomic force microscope, such as that disclosed by Binnig in U.S. Pat. No. 4,724,318, incorporated herein by reference, with an attached tunneling tip.

In a preferred embodiment, the tunneling tip is part of a scanning tunneling microscope operated in constant current mode with a tunneling current of 1nA and a substrate bias voltage of 650 mV. The scanning tunneling microscope has a characteristic thermal drift of about 0.2 Angstroms per second and is capable of atomic resolution of carbon atoms in HOP graphite. The piezo elements are separately calibrated by measuring the periodicity of a 3600 line/mm holographic diffraction grating and the lattice constant of HOP graphite The device is operated in air, but the nanoetching according to the method of the present invention is also feasible in a vacuum or in liquids.

Figure 1:
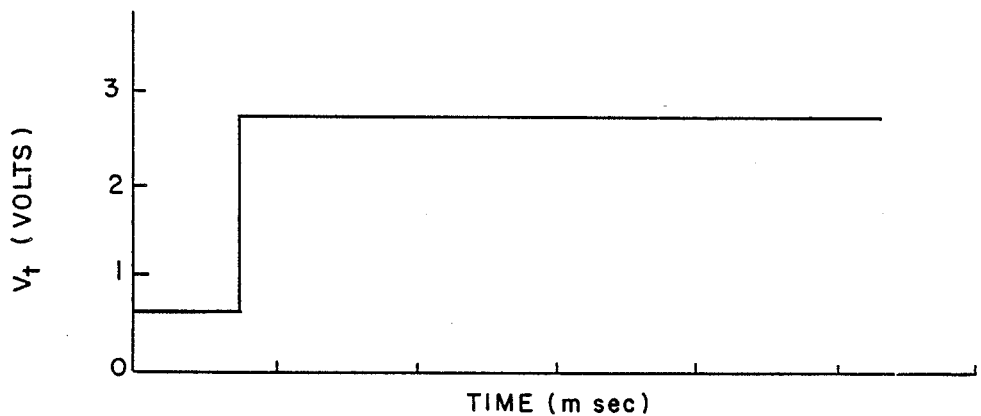
FIG. 1 is a graph showing the bias voltage $V_t$ (volts) vs. time (milliseconds) applied across a tunneling tip of a scanning tunneling microscope and a gold substrate.

The formation of topographic depressions having the form of a crater is initiated by applying a computer controlled voltage pulse such as shown in FIG. 1 between the tunneling tip and a gold substrate at a predetermined point in a scanning tunneling microscope scan. For the gold substrate, step-pulsing the bias voltage to at least about 2.7 volts from an initial bias of 0.65 volts is sufficient to cause a transient increase in the tunneling current such that vaporative removal of substrate material in the region about the tunneling tip occurs. A transient tunneling current of between about 10 nanoamperes and about 100 nanoamperes for less than about 500 microseconds has been found to form reproducible craters in a gold substrate. power densities appropriate for other substrates can be determined empirically.

Figure 2:
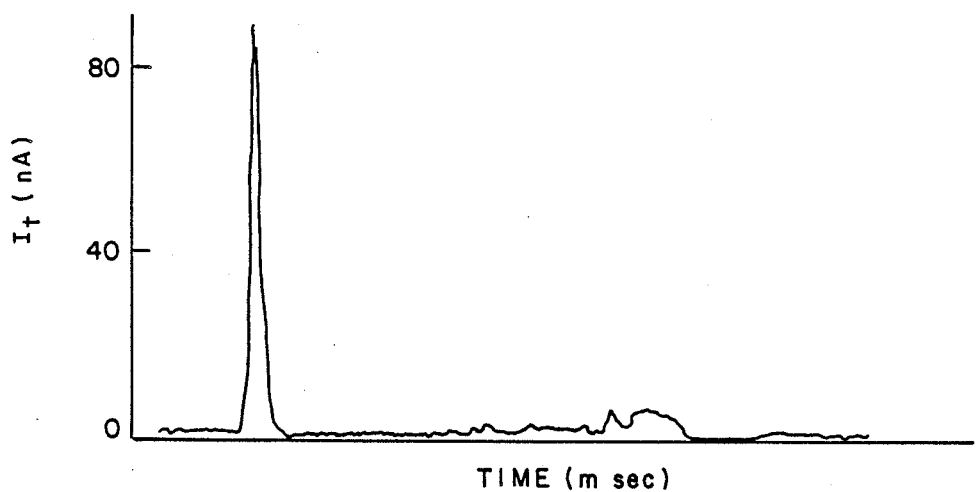
FIG. 2 is a graph showing response of the tunneling current $I_t$ (nanoamperes) vs. time (milliseconds) applied between a tunneling tip of a scanning tunneling microscope and a gold substrate to an increase in bias voltage as shown in FIG. 1.
Figure 3:
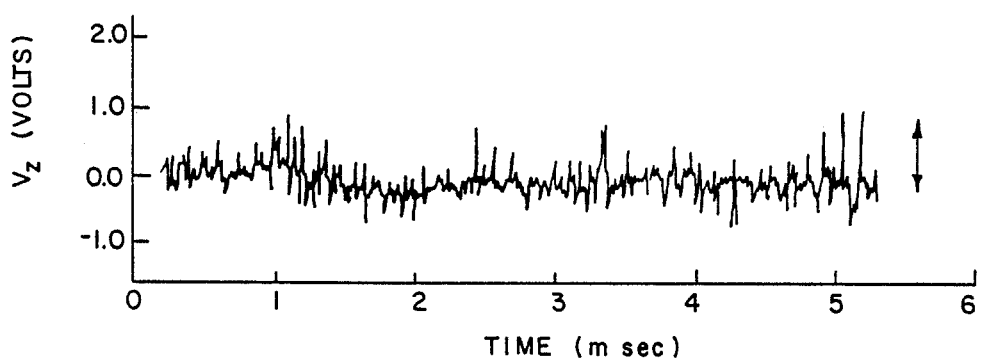
FIG. 3 is a graph showing the voltage $V_z$ (volts) applied to a z-piezo element vs. time (milliseconds) throughout the same time as shown in FIG. 1 and FIG. 2.
Figure 4:
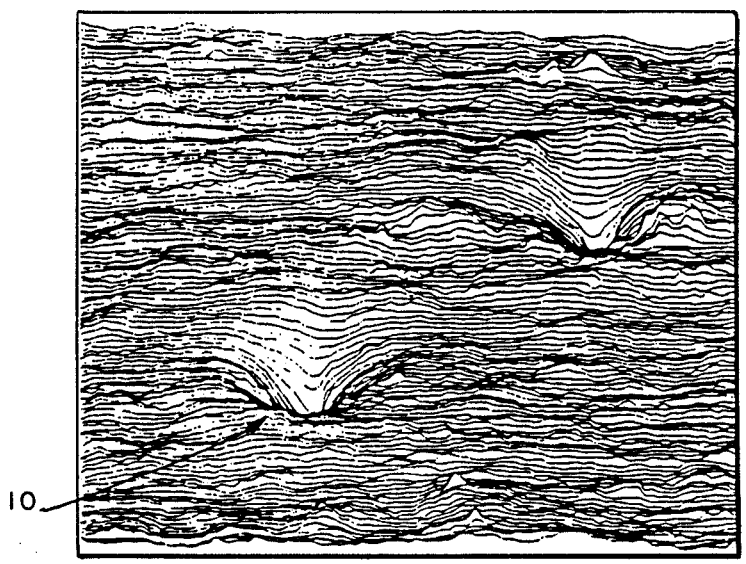
FIG. 4 is a scanning tunneling microscope image of a gold substrate with craters formed by the application of a transient current (10 indicates a crater 6 nm in diameter)

As shown in FIG. 2, a transient 100 nanoampere current applied for about 200 microseconds forms a crater 10 shown in FIG. 4. Because the constant current feedback loop to the z-piezo element is maintained during application of the bias voltage pulse, the tip initially moves away from the surface and then returns to its original position where the detected tunneling current is equivalent to a predetermined value at the applied bias voltage. FIG. 3 illustrates the adjustments in the voltage applied to the z-piezo element during the formation of the crater shown in FIG. 4. The magnitude of the applied bias voltage, the time over which the bias voltage is increased, the speed and sensitivity of the z-piezo feedback control circuit, and the inertial mass of the scanner assembly factors that can affect substrate etching in accordance with this invention. These parameters can be adjusted to decrease or lengthen the duration and intensity of tunneling current required to form uniform topographic depressions.

The transient increase in tunneling current causes an increase in power density sufficient to evaporate or vaporize a localized area of the substrate surface. A lower limit estimate of the transient current density needed to produce the crater 10 shown in FIG. 4 is about $5 \times 10^5 A/cm^2$. Such estimate was made by dividing the peak tunneling current by the area of the crater 10. The power applied to the gold substrate is greater than $2 \times 10^6 W/cm^2$, which results in an intense local heating that explosively evaporates (vaporizes) a portion of the substrate material.

Well defined craters with diameters as small as 1 nanometer can be reproducibly formed using this method. The depth of each crater is about one quarter its diameter, and there is generally no evidence of material about the rim of the crater. The craters produced by this nanoetching technique are stable, and are not filled by surface diffusion of gold atoms over long time periods. Individual craters have been observed for over two hours before drifting out of the field of view of the scanning tunneling microscope. A short (less than 1 millisecond) duration of the tunneling current pulse appears to be critical to crater formation in gold substrates.

Figure 8:
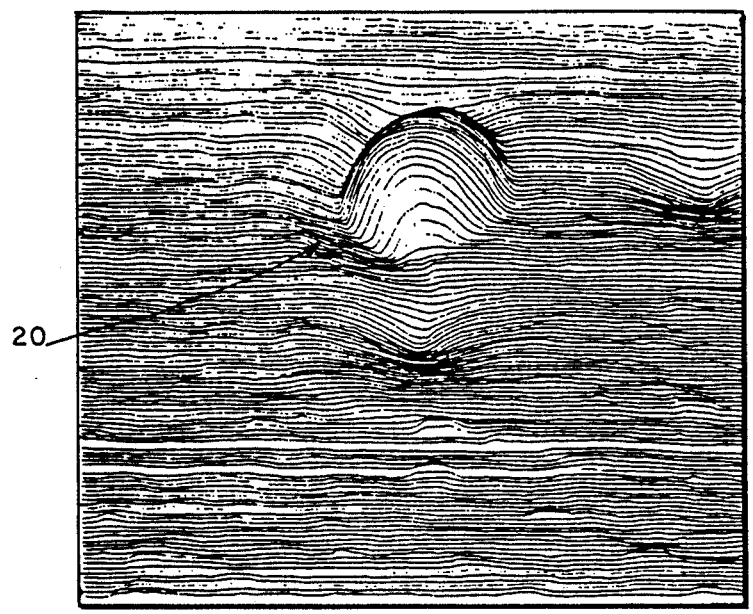
FIG. 8 is a scanning tunneling microscope image of the gold substrate in FIG. 4 with a hillock 20 (10 nm in diameter) formed by the application of a long term current.
Figure 5:
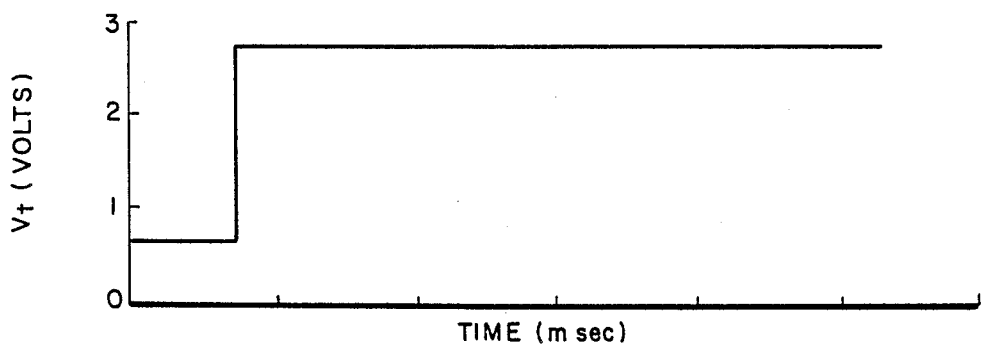
FIG. 5 is a graph showing the bias voltage $V_t$ (volts) vs. time (milliseconds) applied across a tunneling tip of a scanning tunneling microscope and a gold substrate.
Figure 6:
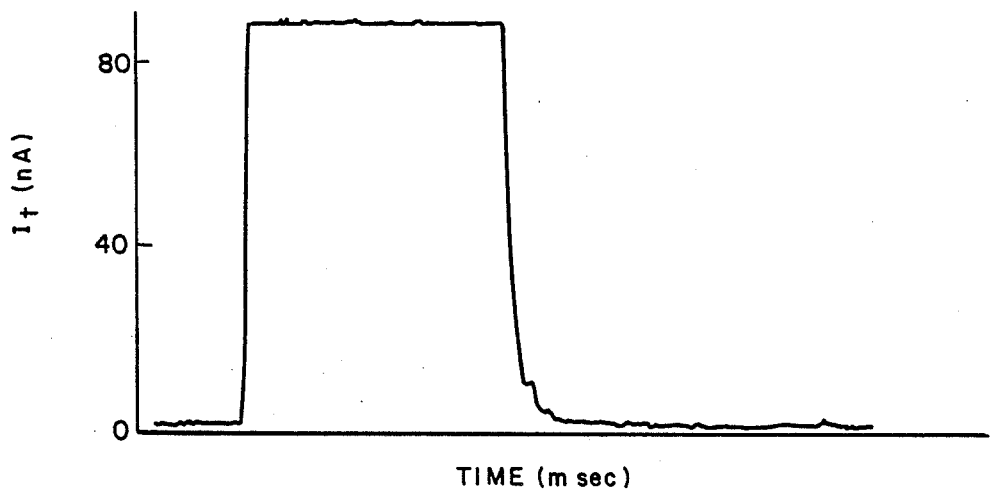
FIG. 6 is a graph showing the saturated response of the tunneling current $I_t$ (nanoamperes) vs. time (milliseconds) applied between a tunneling tip of a scanning tunneling microscope and a gold substrate to an increase in bias voltage as shown in FIG. 5.
Figure 7:
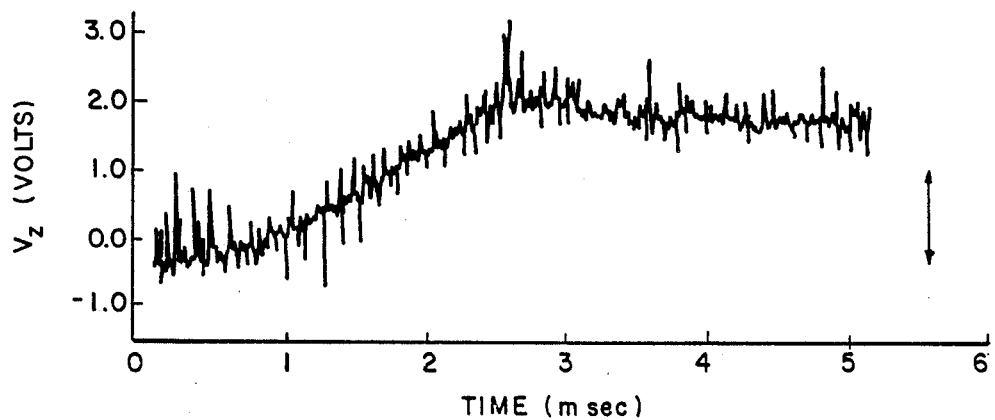
FIG. 7 is a graph showing the voltage $V_z$ (volts) applied to a z-piezo element vs. time (milliseconds) throughout the same time as shown in FIG. 5 and FIG. 6.

Distinct and reproducible craters are not formed if the increase in tunneling current is of longer duration. Long term application (about 2 milliseconds) of a tunneling current greater than 100 na (shown in FIG. 6) between the tunneling tip and the substrate results in the formation of a hillock 20 shown in FIG. 8. Although hillock 20 was formed in response to current increase caused by a stepwise increase in bias voltage shown in FIG. 5, due to unknown interactions with the substrate a long duration current was created, causing local melting instead of explosive evaporation of the substrate. FIG. 7 illustrates the voltage app lied to the z-piezo element during formation of the hillock. Ill-defined craters and large mounds, of up to 20 nanometer diameter can be formed by a long term tunneling current. An important aspect of this invention is the ability to identify the size and morphology of the created marks by monitoring the tunneling current.

Formation of lines and two dimensional patterns on a nanometer scale is possible using the method of this invention. The patterns formed can be used to either store information or in the fabrication, modification, or repair of devices having nanometer scale features. For example, using a computer generated template for applying discrete voltage pulses while scanning a gold substrate a planck's constant symbol "$\pi$" has been formed. The figure was created by applying 201 voltage pulses out of a possible 10,000 which could be distinguishably applied during a scanning tunneling microscope scan. The complete figure is about 65 nanometers high by 40 nanometers wide and is about 2 nanometers deep. A minimum line width of 2 nanometers was achieved.

Lithographic techniques are also possible if the substrate is coated with a covalently bound organic monolayer. Self-assembling monomolecular films comprising $C_{12}$–$C_{18}$ carbon chains can be attached, for example, by means of a terminal thiol group to the surface of an atomically smooth gold substrate. Although the monomolecular film may not be sufficiently conductive to be a conducting substrate suitable for application of a substantial tunneling current, a transient increase in tunneling current such as previously described explosively vaporizes both the gold substrate and any attached organic molecules at a predetermined position.

We claim:

1. A method for creating topographic depressions on a conducting substrate by localized vaporization of the substrate surface on a nanometer scale comprising the steps of:
   positioning a tunneling tip over said surface so that a tunneling current is detectable in said tunneling tip upon application of a predetermined bias voltage; and
   transiently increasing the tunneling current to create a power density sufficient to cause localized evaporation of the substrate surface.

2. The method of claim 1 wherein the conducting substrate is atomically flat gold.

3. The method of claim 2 wherein the atomically flat gold has a surficial monolayer of a covalently bound organic compound.

4. The method of claim 3 wherein the organic compound comprises a $C_{12}$–$C_{18}$ carbon chain with a terminal thiol group.

5. The method of claim 1 wherein the tunneling current is transiently increased by application of a stepped bias voltage pulse.

6. A method for electroetching a gold substrate on a nanometer scale utilizing a scanning tunneling microscope Comprising the steps of:
   positioning a tunneling tip of the scanning tunneling microscope over the surface of the gold substrate so that a tunnelrng current is detected in said tunneling tip upon application of a predetermined voltage bias; and
   transiently increasing the tunneling current to about 100 nanoamperes for less than about 500 microseconds.

7. The method of claim 6 wherein the tunneling current is transiently increased by application of a stepped bias voltage pulse.

8. A data storage method comprising the steps of:
   (1) positioning a tunneling tip over a conducting surface so that a tunneling current is detectable in said tunneling tip upon application of a predetermined bias voltage;
   (2) transiently increasing the tunneling current to create a power density sufficient to cause localized evaporation of the substrate surface; and
   (3) repeating steps (1) and (2) to create an information encoding pattern in the substrate surface.

9. A lithographic method utilizing localized vaporization of a resist layer on a conducting surface on a nanometer scale comprising the steps of:
  treating a substrate surface to form a resist layer comprising a covalently bound monomolecular layer of an organic compound;
  positioning a tunneling tip over a selected area of said resist layer bearing surface so that a tunneling current is detected in said tunneling tip upon application of a predetermined bias voltage; and
  transiently increasing the tunneling current to create a power density sufficient to cause localized vaporization of the resist layer.

* * * * *

UNITED STATES PATENT AND TRADEMARK OFFICE
CERTIFICATE OF CORRECTION

PATENT NO. : 4,896,044

DATED : January 23, 1990

INVENTOR(S) : Li et al.

It is certified that error appears in the above-identified patent and that said Letters Patent is hereby corrected as shown below:

In column 1, line 13, please insert a new paragraph as follows:
--This Invention was made with Government support under Contract No. DE-FG02-84ER45162 awarded by the Department of Energy. The Government has certain rights in this invention.--

Signed and Sealed this

Seventeenth Day of March, 1992

Attest:

HARRY F. MANBECK, JR.

*Attesting Officer*  *Commissioner of Patents and Trademarks*